April 26, 1966 YOSHIRO BUDO ET AL 3,248,256

VACUUM EVAPORATION METHOD TO OBTAIN SILICON DIOXIDE FILM

Filed July 26, 1962 2 Sheets-Sheet 1

INVENTORS
YOSHIRO BUDO
HOLLIS L. CASWELL
JOSEPH R. PRIEST

BY S. P. Tedesco

ATTORNEY 3,248,256
Patented Apr. 26, 1966

3,248,256

VACUUM EVAPORATION METHOD TO OBTAIN SILICON DIOXIDE FILM

Yoshiro Budo, Shrub Oak, Hollis L. Caswell, Mount Kisco, and Joseph R. Priest, Putnam Valley, N.Y., assignors to International Business Machines Corporation, New York, N.Y., a corporation of New York Filed July 26, 1962, Ser. No. 212,664
2 Claims. (Cl. 117—106)

This invention relates to improved techniques for depositing well-defined patterns of stable thin films of silicon dioxide ($SiO_2$) either as a single layer or as a thin interlayer between other organic or metallic thin films. A stable film is defined as one having residual stresses structurally compatible with and also chemically inert both with respect to the substrate material and/or other layers contiguous therewith.

Recent technological advances have created an intense interest in silicon monoxide (SiO) and silicon dioxide ($SiO_2$), the selection of one of the aforementioned silicon oxides for a particular application being predicated upon the peculiar characteristics exhibited by each. For example, distinguishing characteristics of silicon monoxide and silicon dioxide are that (1) silicon monoxide exhibits an index or refraction of 2.0 and is absorptive in the blue region of the visible spectrum whereas silicon dioxide exhibits an index or refraction of 1.5 and passes the entire visible spectrum; (2) when formed as a thin film, silicon monoxide exhibits an anisotropic tensile stress whereas silicon dioxide exhibits an isotropic compressive stress, i.e. the stress is not dependent on the angle of incidence of the evaporant beam; (3) silicon monoxide is nearly impossible to etch whereas silicon dioxide is easily etched, for example, by hydrofloric acid. A common characteristic of silicon monoxide and silicon dioxide, however, is that each is a dielectric.

Advance in the field of electronics and also the present trend toward microminiaturization have introduced numerous new uses for silicon oxides. For example, in the field of transistor fabrication, thin films of silicon oxides are often employed as diffusion masks. In such applications, thin films of silicon oxides are formed over the surface of a semiconductor wafer by vacuum deposition techniques or, in the case of a silicon wafer, by thermal oxidation of the wafer surface. Minute portions of the silicon oxide film are selectively etched to expose selected areas of the wafer to vapors or other sources of impurities or to receive evaporated metal contacts; portions of the silicon oxide film remaining on the surface of the wafer serve as a passivating layer for the junction thus formed. For such applications, the characteristics of thin films of silicon dioxide are much more definitely preferred. Due to the difficulties heretofore encountered in forming stable silicon dioxide films, tedious techniques have had to be developed for etching silicon monoxide films; however, it has long been recognized that pure silicon dioxide films would be more highly suitable for these purposes.

Another, and in no way exhaustive, use of silicon oxides is as insulating layers in the fabrication of multilayer electrical circuit components, e.g. cryotrons, capacitors, etc.; both silicon monoxide and silicon dioxide are adequate for producing insulation between metallic layers comprising such components. These electrical components, for example, are fabricated on a substrate by evaporation/deposition processes, a thin film of silicon oxide material being deposited as an insulating layer between metallic layers, e.g. the gate and control conductors of a cryotron. The residual stresses and also the coefficient of thermal expansion of such insulating layers must be compatible in the multilayer electrical component when subjected to operational parameters, e.g. cryogenic operating temperatures of 4.2° K. Since silicon dioxide films exhibit a small residual compressive stress, they are structurally compatible in such applications as are films formed of silicon monoxide. Due to this residual compressive stress, silicon dioxide films are structurally more compatible for use in electrical components operated at normal room temperatures, e.g. capacitors.

In each of the aforementioned applications, silicon oxide films have been formed by the evaporation/deposition of silicon monoxide onto a substrate in a vacuum system having selected parameters. It is known that the chemical composition and also physical characteristics of the condensate films are markedly affected by system parameters; however, the final composition of the condensate film must bear some relationship to the composition of the evaporant beam. Such parameters include evaporation rate, evaporation source temperature, residual gases within the system, angle of incidence of the evaporant beam, and also source-to-substrate distance. Further, it has been observed that film stability is related to residual stresses induced in such films during the deposition process as determined by the aforementioned system parameters. For example, excessive compressive stress can cause the film to "crinkle" and thus buckle away from the substrate; conversely, excessive tensile stress can cause a film to "crack" so as to cause electrical shorts when employed as an insulating layer. In addition, system parameters have a pronounced effect on the character of the films, i.e. loose or dense structure. For example, it is known that films having a loose structure are more susceptible to oxidation and, therefore, less stable when exposed to the atmosphere than are more dense films.

In accordance with prior art techinques, substantially pure films of silicon dioxide are deposited by the evaporation/deposition of silicon monoxide in oxygen partial pressures of greater than or equal to $10^{-4}$ torrs and at low evaporation rates (5 A./sec.) to effect the probable reaction $SiO+1/2O_2 \rightarrow SiO_2$. In an oxygen partial pressure of less than or equal to $10^{-4}$ torrs, the condensate is incompletely oxidized and, therefore, is composed of both silicon monoxide and silicon dioxide; moreover, such films have a loose structure and often rupture when exposed to the atmosphere. To form well-defined patterns of condensate on a substrate, however, condensation of the evaporant must be effected through a pattern mask at system pressures, e.g. $10^{-5}$ torrs, to minimize scattering of the evaporant beam by residual gases. At greater system pressure, i.e. $10^{-3}$ to $10^{-4}$ torrs, collisions between evaporant beam and residual gases cause the individual molecules to pass through the pattern mask at more random angles than if no collision had taken place; the edges of the resultant condensate pattern, therefore, are not well-defined but rather exhibit a penumbra or gradually diminishing thickness. While penumbra along the edges of insulating film would not affect the operation of the electrical component, edge sharpness is of important where tolerances are extremely critical. For example, in the fabrication of a cryotron circuit array, such penumbra could extend over a section of a previously deposited metallic layer or connecting pin in a substrate and onto which a subsequent metallic layer is to be deposited in electrical contact. As substantially pure films of silicon dioxide cannot be deposited in these large system pressures, it has been necessary in certain situations where the characteristics of silicon dioxide films are more to be desired to accept film patterns of silicon monoxide or other materials having less desirable characteristics.

Accordingly, one object of this invention is to provide an improved method for forming stable thin films of pure silicon dioxide.

Another object of this invention is to provide a method employing conventional apparatus for effecting evaporation/deposition of stable thin films of substantially pure silicon dioxide.

Another object of this invention is to provide for the deposition of well-defined patterns of substantially pure silicon dioxide films in system pressures of less than $10^{-4}$ torrs.

In accordance with the particular aspects of this invention, it has been observed that water vapor is an order of magnitude more effective than a same partial pressure of oxygen to oxidize a silicon monoxide evaporant beam when evaporation source temperature is maintained below 1200° C. Accordingly, well-defined patterns of stable films of substantially pure silicon dioxide, therefore, can be deposited at system pressures in the order of $10^{-5}$ torrs when the oxidizing atmosphere consists essentially of water vapor so as to support the probable reaction $SiO+H_2O \rightarrow SiO_2+H_2$. System pressures in the order of $10^{-5}$ torrs are compatible with the formation of well-defined patterns of condensate onto the substrate through evaporation or pattern masks. Moreover, the evaporation source temperature is sufficiently low to minimize spitting or sputtering during sublimation of the silicon monoxide charge.

The foregoing and other objects, features, and advantages of the invention will be apparent from the following more particular description of preferred embodiments of the invention, as illustrated in the accompanying drawings.

This invention is hereinafter to be described with respect to the fabrication of film cryotron devices; however, it is to be understood that the methods of this invention are applicable whenever substantially pure films of silicon dioxide are to be formed either as a sheet or in a pattern on a substrate structure.

Figure 1:
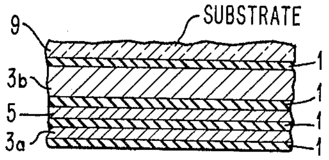
FIG. 1 shows a cross-sectional view of a film cryotron device having insulating layers of silicon dioxide and fabricated in accordance with the principles of this invention.
Figure 2:
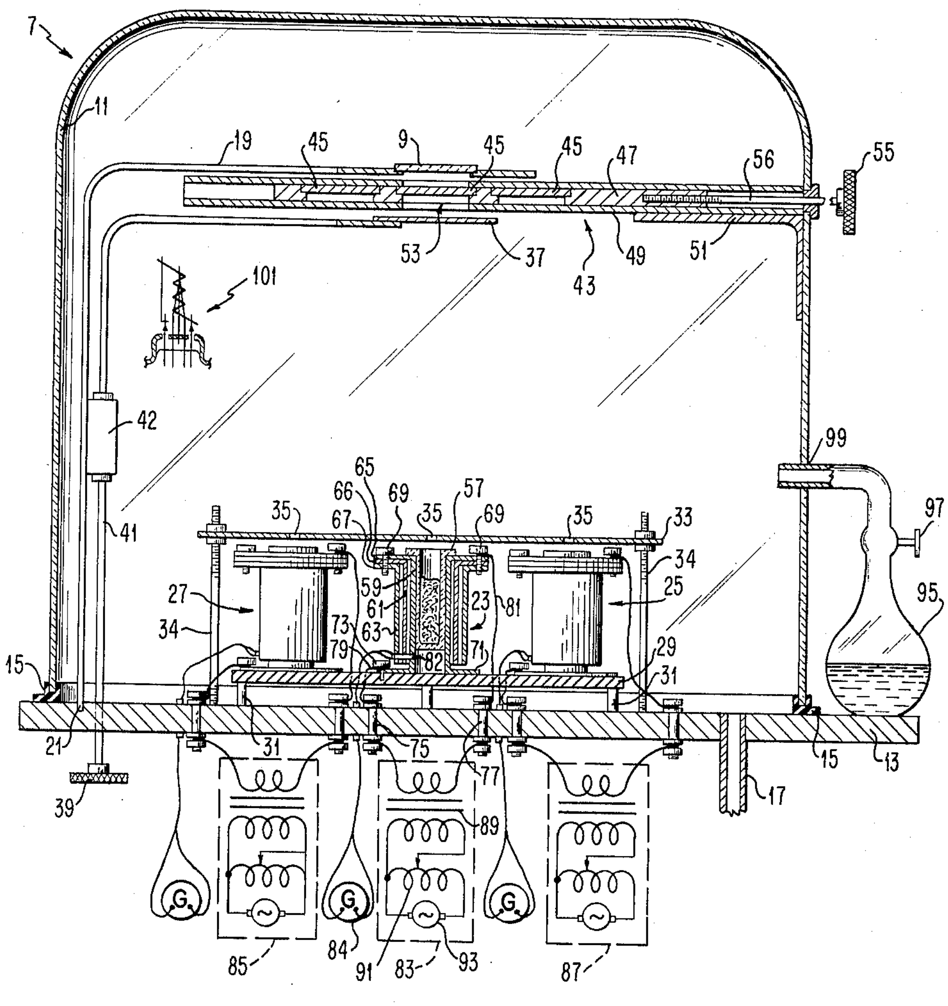
FIG. 2 shows a cross-sectional view of a vacuum system for fabricating a film cryotron device of the type illustrated in FIG. 1.

The cryotron device of FIG. 1 comprises thin films 1 of silicon dioxide, i.e. in the order of 5000 A. between which are interposed by successive evaporation/condensation processes thin layers of lead (Pb) 3*a* and 3*b* and tin (Sn) 5, the entire multilayer combination being supported on a substrate structure 9. These successive evaporation/condensation processes are effected within an evaporating chamber 7 such as indicated by FIG. 2, hereinafter described. As illustrated in FIG.1, the layer of tin 5 constitutes the gate conductor of the cryotron device which is alternated between the superconducting and resistive states by the influence of a magnetic field generated by current flow of at least a critical magnitude through the control conductor 3*a*. The lead layer 3*b* constitutes a superconducting magnetic shield layer to reduce the inductance and increase the current carrying capacity of the tin gate layer 5 in the superconducting state.

A full understanding of cryotron devices of the type shown may be had by reference to "Superconducting Circuits," by D. R. Young, which appeared on pages 1–31 in Progress in Cryogenics, edited by K. Mendelssohn and also in "Superconducting Computers," by William B. Ittner III and C. J. Krauss, which appeared on page 124 of Scientific American, July 1961.

Basically, the operation of cryotron devices is based upon the physical phenomenon of superconductivity which is a property of certain materials, e.g. lead, tin, etc., to exhibit no electrical resistance below a critical temperature which approaches absolute zero temperature. The fact that the cryotron of FIG. 1 is normally maintained at an operating temperature below the critical temperature of the gate tin layer 5, say 3.3° K., has presented numerous fabricating problems. For example, when subjected to such operating temperature stresses, both residual and due to differences in the coefficients of thermal expansion of the respective component layers and also the substrate 9 must be such as not to rupture such layers, i.e. silicon dioxide layers 1. In this event, the adjacent gate tin layer 5 and the control and/or shield layers 3*a* and 3*b* would "short" to cause malfunction of the cryotron device. As the residual stress of pure silicon dioxide films is slightly compressive at room temperatures, insulating layers 1 when deposited on, for example, a glass substrate are well able to withstand the thermal shock of being abruptly reduced from room temperatures to liquid helium operating temperatures.

Insulating films 1 of silicon dioxide can be deposited from a silicon monoxide charge in a system 7 as shown in FIG. 2. The apparatus, as shown, is operative to effect successive evaporation/condensation processes relative to each layer of the multilayer cryotron device of FIG. 1. The rim of bell jar 11 is received within an annular groove in a circular, rubber gasket 15. Gasket 15 provides an effective seal at pressures at least to $10^{-7}$ torrs when bell jar 11 is evacuated along an exhaust pipe 17. Exhaust pipe 17 extends through base plate 13 and connected at its other end to an efficient high vacuum pump, not shown. The various layers of the cryotron device are successively deposited onto substrate 9 which is supported at the upper portion of bell jar 11 by a right angle brace 19, the lower end of which is received in cavity 21 defined in base plate 13.

The silicon monoxide, lead, and tin evaporants to be condensed onto substrate 9 are supplied from the evaporating sources 23, 25, and 27, respectively. The evaporating sources 23, 25, and 27 are mounted in cluster-fashion and in substantially vertical alignment with substrate 9 on a deck plate 29 supported from base plate 13 by insulating spacers 31. A baffle plate 33 is positioned immediately above the evaporating sources 23, 25, and 27 and supported from the base plate 13 on a pair of rods 34. The baffle plate 33 includes a number of apertures 35 aligned one with each of the respective evaporating sources to define point sources of the silicon monoxide, lead, and tin evaporants, respectively. A shutter element 37 is selectively interpositioned between baffle plate 33 and substrate 9 to intercept and prevent spitting onto the substrate 9 during sublimation of the evaporant charge. In accordance with one aspect of this invention, the silicon monoxide is evaporated at source temperature below 1200° C. and in a water vapor partial pressure of $10^{-5}$ torrs. Accordingly, when evaporating source 23 has been elevated to a selected temperature, shutter 37 is horizontally displaceable from over the face of substrate 9 by a control knob 39 disposd exterior of bell jar 11 and below the base plate 13. Control knob 39 is connected to shutter element 37 along a connecting rod 41 supported in a bearing arrangement 42 mounted on brace 19.

Interposed between shutter element 37 and substrate 9 is a masking arrangement 43 for defining patterns of the particular evaporants from sources 23, 25, and 27 to be condensed onto substrate 9. Appropriate masks 45 are arranged in tandem in a carriage member 47 which is slidably supported in a tubular structure 49. The tubular structure 49 is horizontally mounted on the inside face of the bell jar 11 by a bracket memory 51. The individual masks 45 are selectively positioned over the face of the substrate 9 and within an opening 53 provided in the tubular structure 49 to intercept portions of the evaporants directed upwardly from the baffle structure 33. The masks 45 are selectively positioned within opening 53 by horizontally displacing a control knob 55 which is connected with a carriage 47 along a connecting rod 56.

The evaporating sources 23, 25 and 27 herein illustrated are substantially of the type shown and fully described in the E. M. Da Silva Patent 3,104,178, issued on September 17, 1963, and assigned to the same assignee as this invention. Basically, each evaporating source 23, 25, and 27 comprises a removable, tubular charge cartridge 57 received within a cylindrical heater element 59 positioned within a pair of concentric radiation shields 61 and 63. The heater element 59, radiation shields 61 and 63 and also cartridge 57 are fabricated of appropriate refractory material, e.g. tantalum. The heater element 59 and radiation shields 61 and 63 support at corresponding ends annular lip extensions 65, 66, and 67, respectively, of progressively decreasing lengths. The heater element 54 and radiation shields 61 and 63, when inserted one within the other, are maintained in fixed spatial relationship by bolt arrangement 69, respectively. In addition, each heater element 59 supports at its lower end a second annular lip extension 71 by which each of the evaporating sources 23, 25, and 27 are secured to deck plate 59 by bolt arrangement 73, respectively.

Electrical energy is supplied to evaporating sources 23, 25, and 27 individually through feeds 75 and 77 in base plate 13 and along leads 79 and 81. Each pair of leads 79 and 81 is connected to diagonally disposed bolt arrangements 69 and 73, respectively, such that electrical energy passes through the resistive heater element 59. Radiation shields 61 and 63 direct substantially all of thermal energy thus generated inwardly towards the respective cartridges 57 so as to uniformly heat evaporant material contained therein. The precise temperature of the evaporant material source temperature is readily ascertainable by thermocouple 82 positioned on the wall of the heater element 59. This thermocouple 82 may, for example, comprise platinum-platinum plus 10% rhodium and is connected along appropriate leads through the base plate 13 to a meter 84.

Temperature regulators indicated in the dotted enclosures 83, 85, and 87 are exemplary of numerous devices for controlling electrical energy supplied to heater elements 57, respectively, so as to determine source temperature. Each of the temperature regulators 83, 85, and 87 comprise a step-down transformer 89 having a secondary winding electrically connected at each end to the lower exposed ends of feeds 75 and 77, respectively. The primary winding of the transformer 89 is connected across a variable inductance 91, which, in turn, is connected across a source of alternating voltage 93. The variable inductance 91 is adjusted so as to establish source temperatures of the individual evaporating sources at predetermined levels.

In the fabrication of the film cryotron of FIG. 1 evaporating sources 23, 25, and 27 are elevated in turn to temperatures in excess of the evaporating temperatures of materials contained within the respective cartridges 57. Accordingly, patterns of the silicon monoxide, lead, and tin, as defined by the masks 45 are condensed in superimposed fashion onto substrate 9. With respect to the deposition of metallic layers, i.e. the gate tin layer 5, the control lead layer 3*a*, and the shield layer 3*b*, the evaporation/condensation parameters are not critical and the layers, when formed, possess an insignificant residual stress. On the other hand, the system parameters to fully oxidize the silicon monoxide condensate film and produce a stable film of substantially pure silicon dioxide are critical. It is to be noted that the particular system parameters taught are fully compatible with present day evaporation/deposition techniques and result in well-defined patterns of substantially pure silicon dioxide on the substrate 9 when masking techniques are employed; moreover, the above-described apparatus is for all practical purposes conventional. The most significant of these parameters are, firstly, that evaporation source temperature of less than 1200° C.; and secondly, $H_2O$ partial pressure of $5\times10^{-5}$ torrs to support the probable reaction $SiO+H_2O\rightarrow H_2+SiO_2$. To establish such parameters, water vapor from source 95 is introduced through flow valve 97 and along an inlet pipe 99 extending through the wall of bell jar 11. Initially, the pressure within bell jar 11 is reduced and flow valve 97 momentarily opened so as to establish total system pressures not in excess of $5\times10^{-5}$ torrs as measured by a Bayard-Alpert guage 101, electrical connections to which have not been shown.

When the temperature of the silicon monoxide source 23 is equal to or less than 1200° C., the physical characteristics of the condensate film formed on substrate 9 are markedly affected by partial pressures of the residual gases. For example, in FIG. 3, curves I and III and also curves II and IV represent residual stress imparted to the resulting condensate film as the log of the partial pressure of $H_2O$ and $O_2$, respectively, for source temperatures of approximately 1180° C. and also 1300° C. respectively.

When source temperatures are in excess of 1300° C. and system pressures less than $10^{-5}$ torrs, residual stress imparted to the condensate film is substantially constant as it is substantially unaffected by partial pressures of both oxygen and water vapor. This is illustrated by the substantially flat plateau exhibited by curves III and IV of FIG. 3. At partial pressures greater than $10^{-5}$ torrs, however, the effects of oxygen and water vapor are significant. As the partial pressures of either $O_2$ or $H_2O$ is increased from $10^{-5}$ torrs, the residual stress imparted to the condensate film becomes progressively less tensile than $5\times10^{8}$ dynes/cm.$^2$, the characteristic stress of pure silicon monoxide film, and approaches a maximum compressive stress of $3\times10^{-8}$ dynes/cm.$^2$, the characteristic stress of pure silicon dioxide film. This indicates that partial pressures of $O_2$ and $H_2O$ have an effect on the physical properties of the resultant condensate film. It is interesting to note that at high system pressures, $H_2O$ is more effective than $O_2$ to affect the properties of the condensate films as indicated by the greater slope of curve III as compared with that of curve IV.

In accordance with this invention, however, it has been observed that the residual stress of the condensate film is similarly effected when evaporation source temperature is reduced. The effects of various partial pressures of oxygen and water vapor when evaporation source temperature is reduced below 1200° C., i.e. 1180° C., are given by curves I and II, respectively. At these reduced source temperatures, water vapor is much more effective in reducing the stress of the resultant condensate film as indicated by the greater slope of curve I as compared with that of curve II and also with those of curves III and IV. The residual stress imparted to the condensate film becomes less tensile as the partial pressures of $O_2$ and $H_2O$ are increased from $10^{-7}$ torrs. Maximum compressive stress of $3\times10^{8}$ dynes/cm.$^2$ is first achieved at source temperatures of 1200° C. when the partial pressure of $O_2$ is about $10^{-3}$ torrs; however, for a same source temperature, such maximum compressive stress is first achieved when the partial pressure of $H_2O$ is only $5\times10^{-5}$ torrs, or more than an order of magnitude less.

Figure 3:
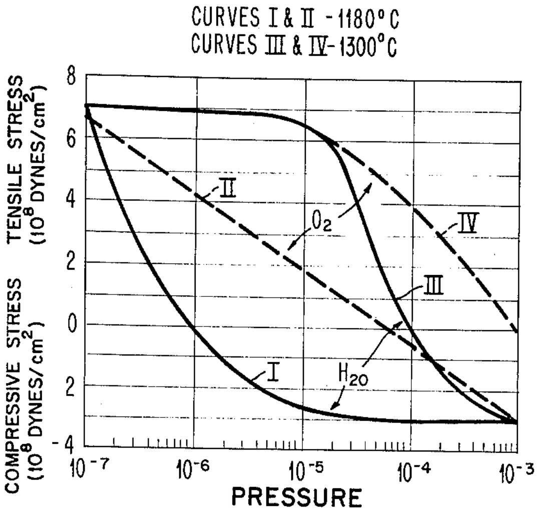
FIG. 3 depicts a series of curves illustrating the effects of partial pressures of oxygen and water vapor on the residual stress imparted to a condensate film for evaporation source temperatures of 1183° C. and 1257° C. For each curve, the source temperature is constant and the respective partial pressures of the specific gases is varied.
Figure 4:
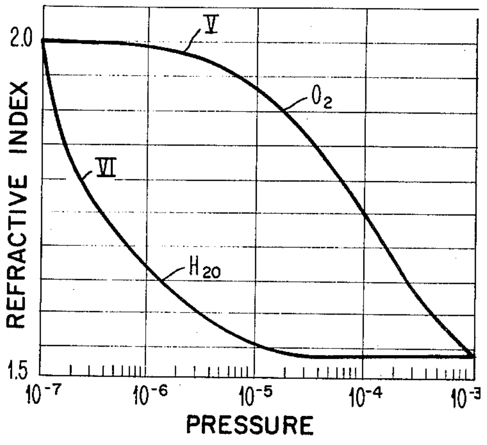
FIG. 4 depicts a series of curves illustrating the effects of partial pressure of oxygen and water vapor on the index or refraction of the resulting condensate film when source temperature is maintained at 1179° C.

Although, the residual stresses imparted to the condensate films in each instant corresponds to the characteristic compressive stress of pure films, the fact that such films are of substantially pure silicon dioxide can be positively ascertained by comparison of the optical properties of the resultant condensate films. Referring to FIG. 4, curves V and VI, the refractive indices of condensate films produced at evaporation source temperatures of approximately 1180° C. are plotted against the log of the partial pressure of oxygen and water vapor, respectively. It is generally known that the refractive indices of silicon monoxide and silicon dioxide are 2.0 and 1.5, respectively. Also, pure silicon monoxide films are absorptive in the blue region of the visible spectrum and, accordingly, appear reddish brown in color. However, as the partial pressure of oxygen and water vapor is increased from $10^{-7}$ torrs to $10^{-3}$ torrs, the color of the condensate film is observed to change from reddish brown through transparency and the refractive index approaches 1.5. Condensate films manifest such optical characteristics when deposited in oxygen partial pressures in excess of $5\times10^{-4}$ torrs; however, such films manifest such optical characteristics when deposited in water vapor partial pressure of $5\times10^{-5}$ torrs. Condensate films which exhibit transparency and a refractive index of 1.5 and also a residual compressive stress, cf. FIG. 3, are identifiable as substantially pure silicon dioxide. As illustrated by curve VI, the substantially greater effect of the $H_2O$ atmosphere to oxidize the silicon monoxide evaporant beam causes the refractive index to decrease sharply toward 1.5. Curve V, on the other hand, illustrates the lesser efficiency of a corresponding partial pressure of oxygen to affect the optical characteristics of the condensate film; at partial pressures up to approximately $2\times10^{-6}$ torrs, the refractive index of the condensate film remains substantially constant and then decreases at a much slower rate than in the case of the $H_2O$ atmosphere.

A comparison of the curves shown in FIGS. 3 and 4, therefore, clearly illustrates that the evaporation/condensation parameters and also the evaporation source temperature can determine the predominate direction of the reaction $SiO+H_2O\rightarrow SiO_2+H_2$. When source temperature is maintained not greater than 1200° C. and the process is effected in a water vapor partial pressure of greater than $5\times10^{-5}$ torrs, the reaction is very heavily in favor of the formation of condensate films of pure silicon dioxide. Moreover, the resultant condensate films are dense and, therefore, stable and do not rupture when exposed to the atmosphere.

Figure 5:
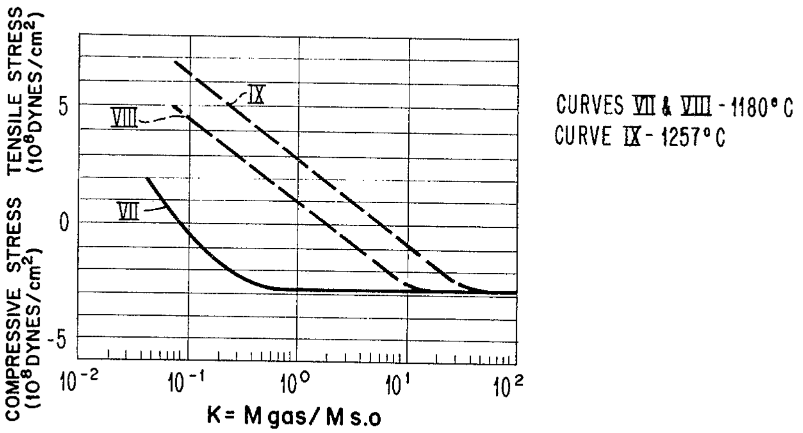
FIG. 5 depicts a series of curves illustrating the respective efficiencies of water vapor and oxygen in oxidizing a silicon monoxide evaporant beam to form films of substantially pure silicon dioxide. This curve illustrated is a plot of residual stress versus K which is defined as the ratio of gas molecules to silicon monoxide molecules striking a unit area of substrate per unit time.

The greater efficiency in forming the silicon dioxide films in a water vapor atmosphere is more clearly brought out by the curves VII, VIII, and IX of FIG. 5 wherein residual stress imparted to the condensate film is plotted against the log of K designating the ratio or residual gas molecules striking a unit area of substrate 9 to molecules of the evaporant silicon monoxide adhering to the said unit area per unit time. Curves VII and IX illustrate the residual stress imparted to the condensate film when formed in a water vapor partial pressure at source temperatures of 1180° C. and 1257° C., respectively; curve VIII, on the other hand, illustrates the residual stress imparted to the condensate film when deposited in oxygen partial pressures at a source temperature of 1180° C. A comparison of curves VII and VIII illustrates that maximum compressive stress of $3\times10^8$ dynes/cm.$^2$ is imparted to the condensate film when $K(H_2O)=1$ and when $K(O_2)=10$. Therefore, at source temperatures less than 1200° C., i.e. 1180° C., water vapor is more effective by a full order of magnitude in reducing the silicon monoxide condensate film to silicon dioxide than is oxygen. The criticality of source temperature in the above-described process is more clearly evidenced when curve IX is compared with curves VII and VIII of FIG. 4. Such comparison indicates that residual stress imparted to the condensate film is a function not only of $K(H_2O)$ but also of source temperature. As illustrated by curve IX, a larger value of $K(H_2O)$ is required to impart maximum compressive stress to the condensate film as source temperature is increased to 1257° C.; it is interesting to note that at these elevated source temperatures, partial pressure of water vapor is less efficient in reducing the silicon monoxide condensate film than a corresponding partial pressure of oxygen at a reduced source temperature, cf. curve VIII.

Curves VII, VIII, and IX appear to indicate that the above-identified reactions for the formation of silicon dioxide is not a gas phase reaction but; rather, occurs when the silicon monoxide evaporant has condensed on the substrate 9. At system pressures of $10^{-5}$ torrs, the mean free path of the silicon monoxide molecule in the beam is generally of the order of the source-to-substrate distance. Accordingly, the number of collisions between the molecules comprising the evaporant beam and residual gas in the bell jar 11 would not be sufficient to completely oxidize the evaporant beam to condense substantially pure silicon dioxide on substrate 9. Further, as source temperature is increased from 1180° C. to 1257° C., the efficiency of the water vapor partial pressure is reduced due to an increased density of the resultant condensate film which reduces the ability of $H_2O$ to diffuse into the film to support the above-described reaction.

While the invention has been particularly shown and described with reference to preferred embodiments thereof, it will be understood by those skilled in the art that various changes in form and details may be made therein without departing from the spirit and scope of the invention.

What is claimed is:

1. A method for forming thin films of substantially pure silicon dioxide material comprising the steps of confining a source of silicon monoxide material and a substrate in a low pressure atmosphere of approximately $5\times10^{-5}$ torr and consisting essentially of a water vapor partial pressure, positioning said substrate with respect to said source such that said silicon monoxide evaporant is condensed thereon, heating said source in excess of the vaporization temperature of said silicon monoxide material and not substantially greater than 1200° C. to determine the rate of condensation of said silicon monoxide evaporant on said substrate such that said silicon monoxide evaporant is substantially completely oxidized to form a substantially pure silicon dioxide condensate, and condensing said silicon monoxide evaporant on said substrate through a pattern defining mask whereby said condensed silicon monoxide evaporant is defined in a predetermined pattern.

2. A method for fabricating multilayer electrical circuit components comprising the steps of confining sources of device materials including silicon monoxide along with a substrate in a low pressure atmosphere, successively evaporating said device materials in turn so as to deposit said silicon monoxide as a thin interlayer pattern between thin layers of others of said materials onto said substrate, determining said low pressure atmosphere at approximately $5\times10^{-5}$ torr and to consist essentially of a water vapor partial pressure during evaporation of said silicon monoxide, heating so as to evaporate said silicon monoxide at a temperature in excess of its vaporization temperature and not substantially greater than 1200° C. so as to be substantially completely oxidized by said water vapor partial pressure when condensed on said substrate, and condensing said silicon monoxide on said substrate through a pattern-defining mask so as to define said thin interlayer pattern.

(References on following page)

References Cited by the Examiner

UNITED STATES PATENTS

| | | | |
|---|---|---|---|
| 2,103,227 | 12/1937 | Druyvestyn | 117—106 |
| 2,879,360 | 3/1959 | Floyd | 117—106 |
| 2,904,450 | 9/1959 | Irland et al. | 117—106 |
| 3,034,924 | 5/1962 | Kraus et al. | 117—33.3 X |
| 3,117,025 | 1/1964 | Learn et al. | 118—49 |

OTHER REFERENCES

Kubaschewski et al.: Academy Press (New York) 1953; pages 64, 79, and 80 relied on.

Holland: Vacuum Deposition of Thin Films, John Wiley and Sons, 1956; pages 485 to 489 relied on.

RICHARD D. NEVIUS, *Primary Examiner.*

A. GOLIAN, *Assistant Examiner.*